United States Patent [19]

Razeghi

[11] Patent Number: 5,599,732
[45] Date of Patent: Feb. 4, 1997

[54] METHOD FOR GROWING III-V SEMICONDUCTOR FILMS USING A COATED REACTION CHAMBER

[75] Inventor: Manijeh Razeghi, Wilmette, Ill.

[73] Assignee: Northwestern University

[21] Appl. No.: 517,172

[22] Filed: Aug. 21, 1995

[51] Int. Cl.$^6$ .................................................. H01L 21/203
[52] U.S. Cl. .......................... 437/105; 437/126; 437/133; 437/107; 117/84; 117/92
[58] Field of Search .......................... 437/107, 105, 437/100, 126, 129, 133; 117/84, 92

[56] References Cited

U.S. PATENT DOCUMENTS

| | | | |
|---|---|---|---|
| 3,964,430 | 6/1970 | Purmal | 118/49 |
| 4,871,587 | 10/1989 | Levin | 427/255.1 |
| 4,873,070 | 10/1989 | Kaji et al. | 423/345 |
| 5,410,178 | 4/1995 | Razeghi | 257/615 |

FOREIGN PATENT DOCUMENTS

| | | |
|---|---|---|
| 58-92217 | 6/1983 | Japan. |
| 58-92218 | 6/1983 | Japan. |

OTHER PUBLICATIONS

Omnes et al., *Recent Advances on GaAs–GaInP Multiquantum Wells Grown by MOCVD on GaAs, InP and Silicon Substrates*, "Materials for Photonic Devices", D'Andrea et al. Eds., pp. 15–36, May 31, 1991.

Sun et al., $Al_xGa_{1-x}N$ *Grown on (00.1) And (01.2) Sapphire*, Inst. Phys. Conf. Ser. 137, 425, Paper presented at the 5th SiC and Related Materials Conf., Washington, D.C., 1993.

Sun et al., *Comparison of the Physical Properties of GaN Thin Films Deposited on (0001) and (0112) Sapphire Substrates*, Appl. Phys. Lett. 63 (7), pp. 973–975, Aug. 16, 1993.

Saxler et al., *High Quality Aluminum Nitride Epitaxial Layers Grown on Sapphire Substrates*, Appl. Phys. Lett. 64 (3), pp. 339–341, Jan. 17, 1994.

Sun et al., *A Crystallographic Model of (00.1) Aluminum Nitride Epitaxial Thin Growth on (00.1) Sapphire Substrate*, J. Appl. Phys. 75 (8), pp. 3964–3967, Apr. 15, 1994.

Kung et al., *Crystallography of Epitaxial Growth of Wurtzite-type Thin Films on Sapphire Substrates*, J. Appl. Phys. 75 (9), pp. 4515–4519, May 1, 1994.

Sun et al., *Thermal Stability of GaN Thin Films Grown on (0001) $Al_2O_3$, (0112) $Al_2O_3$ and $(0001)_{S_5}6H$–SiC Substrates*, J. Appl. Phys. 76 (1), pp. 236–241, Jul. 1, 1994.

Razeghi et al., *Exploration of Entire Range of III–V Semiconductors and their Device Applications*, Materials Science and Technology, vol. 11, Jan., 1995.

Ulmer et al., *Ultra–Violet Detectors for Astrophysics, Present and Future*, SPIE vol. 2397, pp. 210–217, (San Jose, CA) Feb. 6–9, 1995.

Lundquist et al., *Second Harmonic Generation in Hexagonal Silicon Carbide*, Appl. Phys. Lett. 66 (15), 1883–1885, Apr. 10, 1995.

Kung et al., *High Quality AlN and GaN Epilayers Grown on (00.1) Sapphire, (100), and (111) Silicon Substrates*, Appl. Phys. Lett. 66 (22), pp. 2958–2960, May 29, 1995.

Primary Examiner—Robert Kunemund
Assistant Examiner—Ramamohan Rao Paladugu
Attorney, Agent, or Firm—Welsh & Katz, Ltd.

[57] ABSTRACT

In the method of the subject invention, a coating of AlN or a coating of SiC is grown in situ in the MOCVD or MOMBE reaction chamber to cover all surfaces therein. There is thus formed a stable layer on these surfaces that prevents oxygen and other impurities originally within the reaction chamber from reacting with the semiconducting layer to be grown.

13 Claims, 1 Drawing Sheet

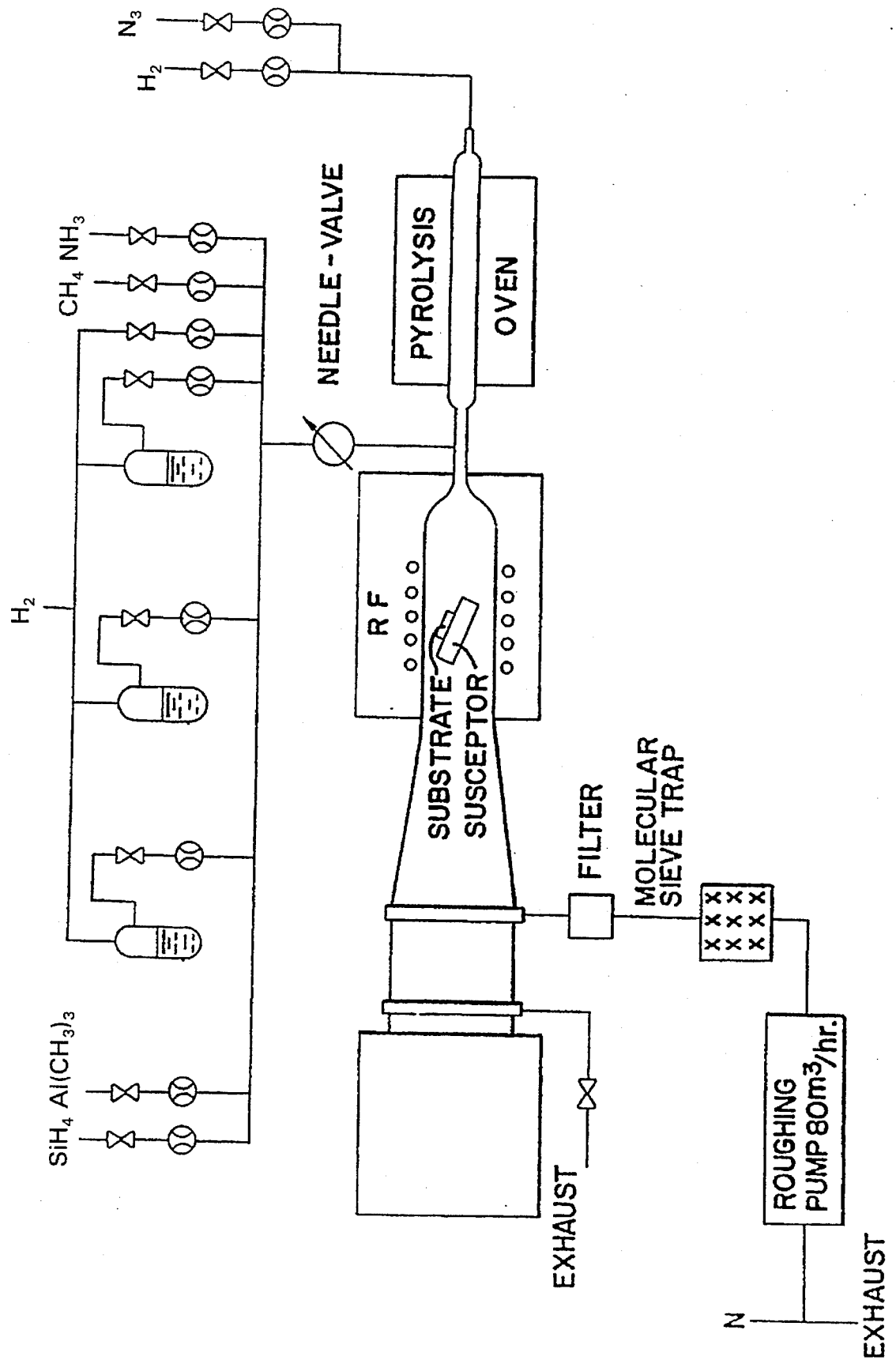

METHOD FOR GROWING III-V SEMICONDUCTOR FILMS USING A COATED REACTION CHAMBER

This invention was made with government support under Grant No. N-00014-93-1-0235 under ONR-BMDO. The government has certain rights in the invention.

This application relates to a method for making semiconductor III–V alloy compounds, and more particularly to a method of preparing a reaction chamber for use in the preparation of III–V alloy compounds.

BACKGROUND OF THE INVENTION

The growth of semiconductor III–V compounds by chemical vapor deposition (CVD) using metallo-organic compounds and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures. The metallo-organic molecular beam epitaxy (MOMBE) process is also a popular growth process for III–V alloys.

Open-tube flow systems are used at atmospheric or reduced pressures in producing the III–V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. Growth by MOCVD takes place far from a thermodynamic equilibrium, and growth rates are determined generally by the arrival rate of material at the growing surface rather than by temperature-dependent reactions between the gas and solid phases.

A problem has developed in the preparation of III–V semiconductors by MOCVD or MOMBE methods in that reproducibility of results is generally lacking. The reproducible growth of high quality, perfect single crystal III-Nitrides with low impurity concentration needs a very controlled growth environment. It is known that impurities and specifically oxygen, even very minor levels, can reduce the quality of a MOCVD grown III-Nitride alloy significantly. Therefore, the reduction of the impurity levels in a III-Nitride alloy should improve the reproducibility and quality of the product. More specifically, the elimination of oxygen from the growth environment of the III-Nitride alloy is very important.

SUMMARY OF THE INVENTION

An object of the subject invention is a method for decreasing impurity levels in a III–V alloy.

A further object is a method for decreasing oxygen impurity levels in the growth environment of a III–V semiconductor.

A still further object is a method of decreasing impurity levels in the reaction chamber when growing III–V semiconductors.

These and other objects are attained by the method of the subject invention wherein all surfaces of the growth reaction chamber is coated with a barrier coating capable of withstanding high temperatures and not reacting with the reactants and dopants utilized therein at such high temperatures. In the method of the subject invention, a coating of AlN or a coating of SiC is grown in situ in the reaction chamber to cover all surfaces therein. There is thus formed a stable layer that prevents oxygen and other impurities originally within the reaction chamber from reacting with the semiconducting layer to be grown.

The invention will be better appreciated and understood by reference to the drawings wherein:

The FIGURE is a schematic showing a MOCVD reactor for use in the method of the subject invention.

The FIGURE is a schematic diagram of the LP-MOCVD reactor for use in the method of the subject invention.

DETAILED DESCRIPTION OF THE INVENTION

The reactor and associated gas-distribution scheme used herein are shown in the FIGURE. The system consists of a cooled quartz reaction tube (diameter 5 cm in the substrate area) pumped by a high-capacity roughing pump (120 hr$^{-1}$) to a vacuum between 10 and 100 millibars. The substrate was mounted on a pyrolyrically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and VCR fittings. Flow rates were controlled by mass flowmeters.

In the MOCVD process, controlled amounts of group III alkyls and group V hydrides or Group V Nitrides are introduced into a reaction chamber that contains a substrate positioned on a heated coated graphite block or susceptor. The hot susceptor has a catalytic effect on the decomposition of the gaseous products, and the growth therefore takes place primarily at this hot surface. This technique allows the growth of high quality multilayers of semiconductor with extremely fine dimensional and compositional control.

Generally speaking, in MOCVD process the reactor is purged with a nitrogen flow of 4 liters min$^{-1}$, and the working pressure of 10–100 millibars, preferably 10 millibars, is established by opening the gate valve that separates the pump and the reactor. The evacuation line that is used at atmospheric pressure is automatically closed by the opening of the gate valve. The gas flow rates are measured under standard conditions, i.e., 1 atm and 20° C., even when the reactor is at subatmospheric pressure. The pressure in the gas panel is regulated by the needle valve placed between the gas panel and the reactor. The needle valve is adjusted to maintain a constant pressure of 10–100 millibars, preferably 10 millibars, on the gas panel, thereby ensuring reproducibility of flow-rate measurements.

In the process of the subject invention and prior to initiating the MOCVD procedure itself, the reaction chamber is first heated to 800°→1200° C., and preferably 1000° C. for a short period, 5–10 minutes; silane and methane are then flowed into the hot reaction chamber in a continuous stream for about 2–3 minutes. In the alternative, ethane or propane may be substituted for methane. Exhaust is provided continuously throughout the entire procedure to maintain the desired pressure. The heat reaction chamber is then purged thoroughly with nitrogen and is ready for the MOCVD process, being fully coated with a buffer layer of SiC.

In the alternative, the reaction chamber may be coated with AlN. Aluminum is highly reactive to any trace of oxygen, and acts as an excellent scavenger for oxygen impurities. Further, AlN is a wide bandgap III-Nitride and has been used as a buffer layer in the growth of other III-Nitride semiconductor layers. Also, AlN is the III-Nitride with the highest bandgap and is the most structurally, chemically and thermally stable compound within the III-Nitride material system. Thus, AlN would appear to be very suitable and compatible for use in a MOCVD procedure.

When depositing AlN as a barrier coating, the reaction chamber is first heated and purged with $N_2$ as above, and pressure established at the desired level. Then the Aluminum precursor is flowed into the reaction chamber to scavenge or collect all the oxygen impurities present. Then Ammonia is flowed into the chamber, thereby creating a thin and amorphous AlN layer throughout the reaction chamber and the growth environment for the ensuing MOCVD procedure. Thus, a stable barrier layer or buffer layer of AlN is formed that passivates the growth environment in the sense that it prevents any oxygen impurities from reacting in the following MOCVD procedure.

EXAMPLES

Example 1

SiC

The reaction chamber of an MOCVD unit is heated to 1000° C. and purged with $N_2$ at 4 l/min for approximately 5 minutes. 50 cc $SiH_4$ and 50 cc $CH_4$ are flowed into the hot reaction chamber at a rate of 20 cc/min for about 2½ minutes while maintaining a pressure of 10 millibars, exhausting continuously. The result is a reaction chamber completely coated with SiC as a barrier to the escape of oxygen impurities in further MOCVD procedures.

Example 2

AlN

The reaction chamber of an MOCVD unit is heated to 1000° C. and purged with $N_2$ for 10 minutes. Pressure is maintained at 10 millibars. 50 cc $Al(CH_3)_3$ is flowed into the hot chamber at a rate of 10 cc/min for a minute, then increased to 20 cc/min while 500 cc $NH_3$ is simultaneously flowed into the chamber at a rate of 250 cc/min, while exhausting continuously. After 2 minutes the reaction chamber is coated with AlN, which acts as a buffer layer, preventing the escape of oxygen impurities in the reaction chamber in further MOCVD procedures.

After the reaction chamber is coated as in Example 1 or 2, III-alkyls and V hydrides may be introduced into the hot reaction chamber to form the desired III–V semiconductor material, with substantially less impurities than heretofore possible.

The methods of the subject invention are simple and easy to use, thereby making such procedure of the subject invention viable for use prior to every MOCVD or MOMBE procedure on a repetitive basis.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed:

1. A method for preparing chamber for use with metallo-organic chemical vapor deposition or metallo-organic molecular beam epitaxy procedures, comprising first forming at temperatures of from about 800° C. to about 1200° C. in situ a barrier coating over all surfaces of the reaction chamber, said barrier coating preventing impurities from said surfaces from interfering with said procedures.

2. The method of claim 1 wherein said method comprises the sept of flowing Al $(CH_3)_3$ with $NH_3$ at about 10 to about 100 millibars through said reaction chamber.

3. The method of claim 1 wherein said method comprises the steps of flowing $SiH_4$ with a compound selected from the group consisting of methane, ethane and propane through said reaction chamber.

4. The method of claim 2 wherein $Al(CH_3)_3$ is allowed to flow first for a period of about 2 minutes.

5. The method of claim 2 wherein the flow rate of $Al(CH_3)_3$ is about 20 cc/min.

6. The method of claim 2 wherein the flow rate of $NH_3$ is about 200 cc/min.

7. The method of claim 3 wherein the flow rate of $SiH_4$, methane, ethane and propane is each about 20 cc/min.

8. The method of claim 1 wherein said step of forming in situ a barrier coating includes the step of forming a coating in situ of AlN or SIC.

9. A method for preparing a reaction chamber for use with metallo-organic chemical vapor disposition or metallo-organic molecular beam epitaxy procedures comprising first forming in situ a barrier coating of AlN over all surfaces of the reaction chamber comprising the steps of flowing $Al(CH_3)_3$ with $NH_3$ at a temperature of about 800° C. to about 1200° C. at 10–100 millibars through said reaction chamber.

10. A method for preparing a reaction chamber for use with metallo-organic chemical vapor disposition or metallo-organic molecular beam epitaxy procedures comprising forming in situ at temperatures of about 800° C. to about 1200° C. a barrier coating of SiC over all surfaces of the reaction chamber comprising the steps of flowing $SiH_4$ with a compound selected from the group consisting of methane, ethane and propane through said reaction chamber.

11. A method for growing III–V semiconductor films comprising the steps of:
   a) heating a reaction chamber having a substrate therein to a temperature of about 800° C. to 1200° C.;
   b) purging with $N_2$;
   c) coating all surfaces of said reaction chamber with SiC or AlN at said temperature;
   d) introducing III-alkyls and V-hydrides to said coated reaction chamber; and
   e) forming said III–V semiconductor film on said substrate.

12. The method of claim 11 wherein the step of coating said surfaces of said reaction chamber includes flowing $Al(CH_3)_3$ into said reaction chamber and flowing $NH_3$ into said reaction chamber.

13. The method of claim 11 wherein the step of coating said surfaces of said reaction chamber includes flowing $SiH_4$ into said reaction chamber and flowing a gas selected from the group consisting of methane, ethane and propane into said reaction chamber.

* * * * *